US007023232B2

(12) United States Patent
Yano et al.

(10) Patent No.: US 7,023,232 B2
(45) Date of Patent: Apr. 4, 2006

(54) IMAGE DISPLAY DEVICE, DRIVE CIRCUIT DEVICE AND DEFECT DETECTION METHOD OF LIGHT-EMITTING DIODE

(75) Inventors: Motoyasu Yano, Kanagawa (JP); Yuichi Takagi, Kanagawa (JP); Yoshihiro Komatsu, Kanagawa (JP); Mitsuru Suzuki, Kanagawa (JP); Masataka Kawase, Kanagawa (JP)

(73) Assignee: Sony Corporation, (JP)

( * ) Notice: Subject to any disclaimer, the term of this patent is extended or adjusted under 35 U.S.C. 154(b) by 120 days.

(21) Appl. No.: 10/799,596

(22) Filed: Mar. 15, 2004

(65) Prior Publication Data

US 2004/0196049 A1 Oct. 7, 2004

(30) Foreign Application Priority Data

Apr. 3, 2003 (JP) .......................... P2003-100117

(51) Int. Cl.
*G09G 3/32* (2006.01)
*G09G 3/14* (2006.01)
*G01R 31/26* (2006.01)

(52) U.S. Cl. ...................... 324/767; 324/770; 324/765; 324/158.1

(58) Field of Classification Search ................. 324/770
See application file for complete search history.

(56) References Cited

U.S. PATENT DOCUMENTS

| | | | | |
|---|---|---|---|---|
| 3,742,356 | A * | 6/1973 | Brock | 324/767 |
| 4,346,347 | A * | 8/1982 | Kamata et al. | 324/767 |
| 2005/0017922 | A1 * | 1/2005 | Devos et al. | 345/6 |

FOREIGN PATENT DOCUMENTS

| | | |
|---|---|---|
| JP | 04-305173 | * 10/1992 |

* cited by examiner

*Primary Examiner*—Vinh Nguyen
*Assistant Examiner*—Emily Y Chan
(74) *Attorney, Agent, or Firm*—Rader, Fishman & Grauer PLLC; Ronald P. Kananen

(57) ABSTRACT

A defect detection of light-emitting diodes (LEDs) is electrically performed on a large-scale display, comprising a plurality of light-emitting diodes arranged by a predetermined arrangement on an image display face, voltage detection portions for applying a constant current to a plurality of light-emitting diodes in an off region at a forward voltage or less in accordance with an input of a signal indicating a defect detection mode and detecting voltages between terminals of light-emitting diodes arising when the constant current flows there through, and a defect detection portion for electrically detecting a defect from the plurality of light-emitting diodes based on detection results of the voltage detection portion; and drive circuit devices (driver ICs) having the above configuration are serially connected and an electric signal indicating a result of defect detection is output from its final stage.

6 Claims, 12 Drawing Sheets

[A] TO [C]: DRIVER IC (DRIVE CIRCUIT DEVICE)
1 : VOLTAGE DETECTION CIRCUIT
Vdac: REFERENCE VOLTAGE
Mode: SIGNAL INDICATING DEFECT DETECTION MODE
SDI: INPUT DATA SIGNAL
ENI: INPUT ENABLE SIGNAL 1A: VOLTAGE DETECTION CIRCUIT
2: POWER SOURCE
3: CONSTANT CURRENT SOURCE
4: COMPARATOR
5: REFERENCE VOLTAGE (Vref) SUPPLY MEANS
D: LIGHT-EMITTING DIODE (LED)
Vd: VOLTAGE BETWEEN TERMINALS
I: CONSTANT CURRENT
Mode: SIGNAL INDICATING DEFECT DETECTION MODE 1B: VOLTAGE DETECTION CIRCUIT
2: POWER SOURCE
3: CONSTANT CURRENT SOURCE
4: COMPARATOR
5: REFERENCE VOLTAGE (Vref) SUPPLY MEANS
D: LIGHT-EMITTING DIODE (LED)
Vd: VOLTAGE BETWEEN TERMINALS
I: CONSTANT CURRENT
Mode: SIGNAL INDICATING DEFECT DETECTION MODE $1_{-1}$~$1_{-N}$: VOLTAGE DETECTION CIRCUIT
10: DEFECT DETECTION CIRCUIT

30: CONTROLLER (DEFECT DETECTION PORTION)
DRIC: DRIVER IC (DRIVE CIRCUIT DEVICE)

30: CONTROLLER (DEFECT DETECTION PORTION)
[A]TO[X] : DRIVER IC (DRIVE CIRCUIT DEVICE)

[A] TO [C]: DRIVER IC (DRIVE CIRCUIT DEVICE)
1 : VOLTAGE DETECTION CIRCUIT
Vdac : REFERENCE VOLTAGE
Mode : SIGNAL INDICATING DEFECT DETECTION MODE
SDI : INPUT DATA SIGNAL
ENI : INPUT ENABLE SIGNAL 7: OUTPUT CIRCUIT
8: LOGIC CALCULATION UNIT
9: TRANSFER REGISTER PORTION
Out1～Outk: COMPARATOR OUTPUT
SDI: INPUT DATA SIGNAL
SDO: OUTPUT DATA SIGNAL 7: OUTPUT CIRCUIT
8: LOGIC CALCULATION UNIT
9: TRANSFER REGISTER PORTION
Out1～Outk: COMPARATOR OUTPUT
SDI: INPUT DATA SIGNAL
SDO: OUTPUT DATA SIGNAL

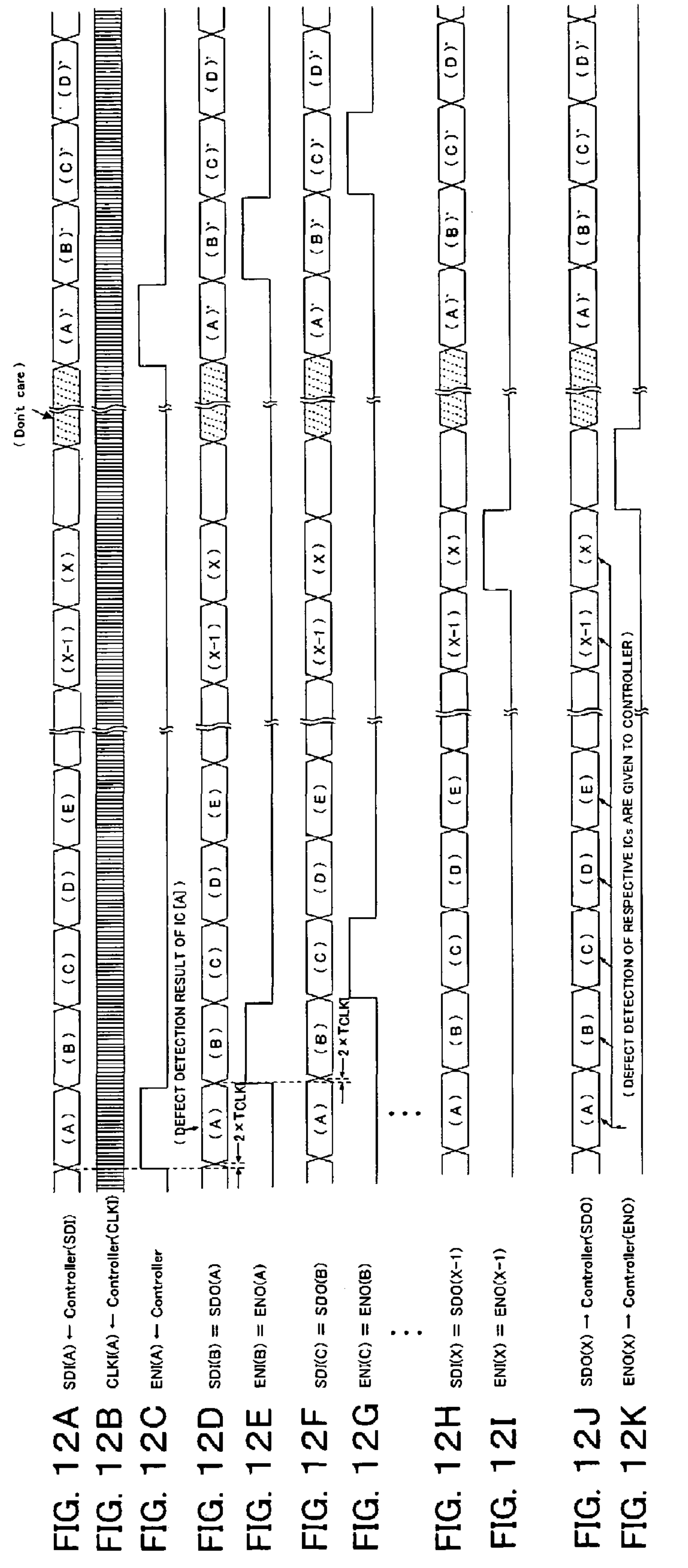
FIG. 12A SDI(A) ← Controller(SDI)
FIG. 12B CLKI(A) ← Controller(CLKI)
FIG. 12C ENI(A) ← Controller
FIG. 12D SDI(B) = SDO(A)
FIG. 12E ENI(B) = ENO(A)
FIG. 12F SDI(C) = SDO(B)
FIG. 12G ENI(C) = ENO(B)
FIG. 12H SDI(X) = SDO(X-1)
FIG. 12I ENI(X) = ENO(X-1)
FIG. 12J SDO(X) → Controller(SDO)
FIG. 12K ENO(X) → Controller(ENO)
( Don't care )
( DEFECT DETECTION RESULT OF IC [A] )
2×TCLK
( DEFECT DETECTION OF RESPECTIVE ICs ARE GIVEN TO CONTROLLER )

IMAGE DISPLAY DEVICE, DRIVE CIRCUIT DEVICE AND DEFECT DETECTION METHOD OF LIGHT-EMITTING DIODE

BACKGROUND OF THE INVENTION

1. Field of the Invention

The present invention relates to an image display device having a function of detecting a defect in a plurality of light-emitting diodes, a drive circuit device, such as a driver IC, and a defect detection method of a light-emitting diode.

2. Description of the Related Art

In a variety of indoor and outdoor event places, indoor and outdoor stadiums and other sport facilities, an image display device for video and information using an LED as an display element (hereinafter, referred to as an LED display) is used for displaying sport live, live telecast and advertisement. In an LED display, a display cell is composed of unit pixels of m lines by n columns. There are monochrome display and color display. In the case of color display, a unit pixel is composed of three LEDs: red (R), green (G) and blue (B).

The LED display used for various uses explained above is generally very large and placed at a high position.

When conducting a test before shipping by operating an LED in a state of being mounted on a display panel or when operating the display in a state of being installed at the use place, electric connection in the LED becomes nearly short-circuited or open due to dusts, temperature and temperature changes, etc. in some cases. In these cases, an LED in a defective condition shows a state of having excessively higher or lower luminance than that of good ones or, furthermore, not illuminating at all, which leads to a deterioration of image quality of the display. A display is arranged with a large number of LEDs and it is possible to specify a defective LED from the luminance. However, in the case of a large-scale LED display used in the above objects, it is very difficult to specify a defective LED by difference of luminance at the time of shipping test because of the large number of the LEDs. Furthermore, when exchanging a defective LED after installment in the use place, judgment of defective or good luminance has to be made, for example, in a state of directly receiving a sun light, so that there are some cases where judgment of defect from good is difficult under a use environment as such. Furthermore, when installed at a high position, a large amount of labor and high maintenance costs are required for exchanging a defective LED.

From the above reasons, there has been a demand for a method of electrically detecting a defective LED or an LED with a high probability of becoming defective before shipping or after installment at the use place.

SUMMARY OF THE INVENTION

A first object of the present invention is to provide an image display device having a configuration capable of electrically detecting a defect of a light-emitting diode (LED) and a drive circuit device, such as a driver IC.

A second object of the present invention is to provide a defect detection method of a light-emitting diode, by which detection of a defect can be performed electrically.

A first aspect of the present invention is to attain the above first object, and there is provided an image display device, comprising a plurality of light-emitting diodes arranged by a predetermined arrangement on an image display face; a voltage detection portion for applying a constant current to said plurality of light-emitting diodes in an off region at a forward voltage or less in accordance with an input of a signal indicating a defect detection mode, and detecting a voltage between terminals of a light emitting diode arising when the constant current flows therethrough; and a defect detection portion for electrically detecting a defect from said plurality of light-emitting diodes based on a detection result of said voltage detection portion.

A second aspect of the present invention is to attain the above first object, and there is provided an image display device, comprising a plurality of light-emitting diodes arranged by a predetermined arrangement on an image display face; a voltage detection portion for applying a constant current to said plurality of light-emitting diodes in accordance with an input of a signal indicating a defect detection mode, and detecting voltages between terminals of light-emitting diodes arising when the constant current flows therethrough; and a defect detection portion for electrically detecting a defect from said plurality of light-emitting diodes by obtaining an isolated point being away from a distribution of said voltages between terminals based on a detection result of said voltage detection portion.

According to the present invention, there is provided a drive circuit device for driving a predetermined number of light-emitting diodes, comprising a voltage detection portion for applying a constant current to said predetermined number of light-emitting diodes in an off region at a forward voltage or less in accordance with an input of a signal indicating a defeat detection mode, and outputting data on voltages between terminals for electrically detecting a defect from said plurality of light-emitting diodes from a difference of voltages between terminals of light-emitting diodes arising when the constant current flows therethrough.

A defect detection method of a light-emitting diode according to the present invention is to attain the above second object, and there is provided a defect detection method of a light-emitting diode for detecting a defect from a plurality of light-emitting diodes, including a first step of applying a constant current to said plurality of light-emitting diodes in an off region at a forward voltage or less and comparing a voltage of one terminal changing in proportion to a voltage between terminals of a light-emitting diode arising when the constant current flows therethrough with a reference voltage for each light-emitting diode; a second step of repeating said first step for a plurality of times while changing said reference voltage; and a third step of electrically specifying a defect from said plurality of light-emitting diodes based on results of said comparison for a plurality of times.

According to the image display device and defect detection method according to the first aspect of the present invention, when a signal indicating a defect detection mode is input, a voltage detection portion makes a constant current flow to the plurality of light-emitting diodes arranged by a predetermined arrangement on an image display face in an off region at not more than a forward voltage. As a result, a voltage between terminals in accordance with a diode characteristic arises between terminals of a light emitting diode. Detection of a voltage between terminals is performed by comparing a voltage of one terminal of a light-emitting diode being proportional to a voltage between terminals with a reference voltage (refer to a first step). A voltage detection portion repeats measurement of heights (comparison of voltages) of the voltage between terminals and the reference voltage, for example, while changing the reference voltage from low to high (refer to a step 2).

Based on a result of the comparison for a plurality of times, the defect detection portion detects a defect and an abnormal one with a high probability of becoming defective (the abnormal ones are included in "defects" in the present invention). In the present invention, since a voltage between terminals in an off region of a forward voltage of a diode, that is Vf, or less is detected, the detection sensitivity is high and, for example, data of particularity having a high probability of being defective is detected easily from data of a voltage between terminals.

Also, particularly according to the second image display device of the present invention, in a distribution of voltages between terminals of good light-emitting diodes, when there is an isolated point being away from an end of the distribution, the isolated point is judged as a defective light-emitting diode or one with a high probability of becoming defective over time. For example, when an isolated point is at a position with a still lower voltage than a lower end of the distribution, the isolated point is judged to be a short-circuited defect or one with a high probability of becoming short-circuited. Inversely, when an isolated point is at a position with a still higher voltage than an upper end of the distribution, the isolated point is judged to be an open defect or one with a high probability of becoming an open defect. The defect detection portion electrically specifies a defect from the plurality of light-emitting diodes, for example, by this method.

BRIEF DESCRIPTION OF DRAWINGS

These and other objects and features of the present invention will become clearer from the following description of the preferred embodiments given with reference to the attached drawings, in which:

FIG. 12 A to FIG. 12K are timing charts of signals for explaining serial transfer of defect detection data when a transfer register portion performs defect detection.

DESCRIPTION OF THE PREFERRED EMBODIMENT

Below, embodiments of the present invention will be explained by taking as an example a color LED display with reference to the drawings.

First Embodiment

Figure 1:
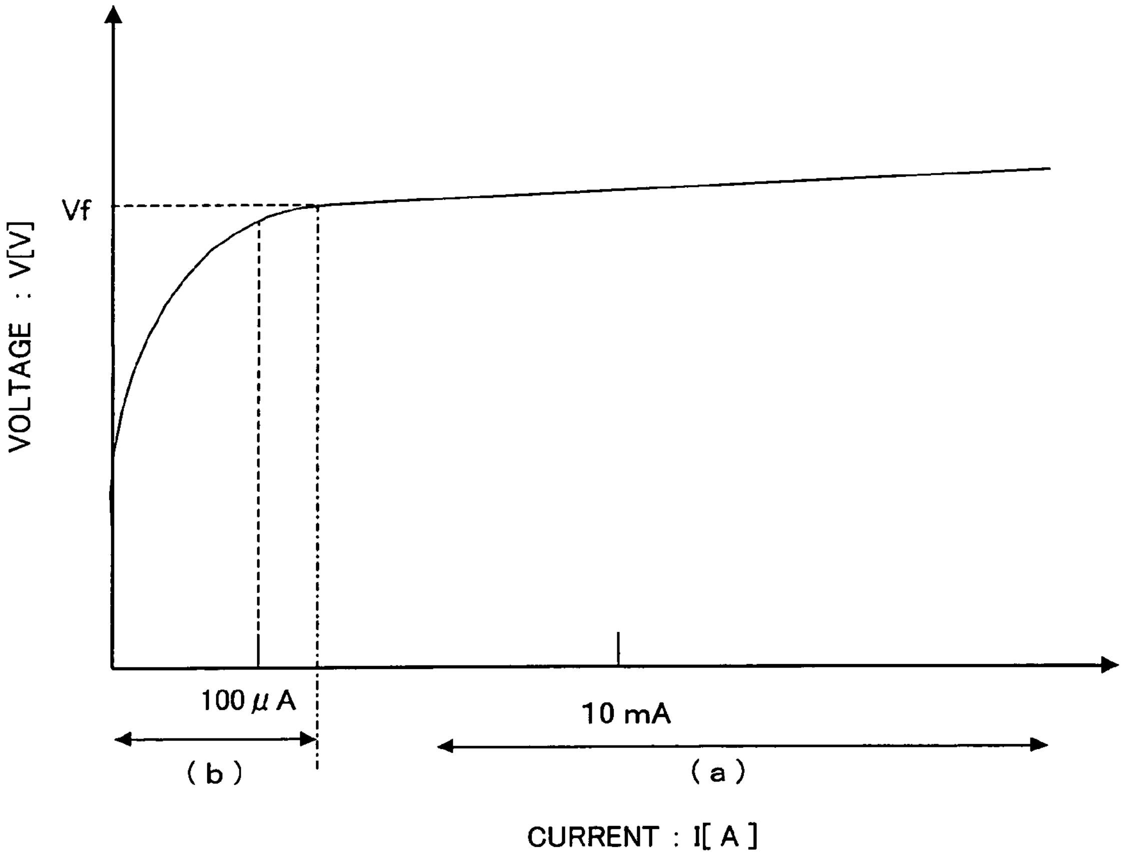
FIG. 1 is a graph of a current-voltage characteristic between LED terminals according to a first embodiment.

FIG. 1 is a graph showing a current-voltage characteristic between LED terminals.

A current flowing in an LED is 1 mA to 80 mA or so when using the LED display (a part (a) in FIG. 1). In this operation region, a voltage change is small with respect to a current change. On the other hand, in an off region with a forward voltage of Vf or less (a part (b) in FIG. 1), a voltage change is large with respect to a current change. Therefore, as a result that a constant current flows in the LED, detection sensitivity can be improved in the off region. In the present embodiment, a voltage between terminals of the LED is detected in the off region from a difference of detected voltages between terminals so as to specify an LED in a defective state close to a short-circuited or open electric connection or one in a quasi-defective state with a high probability of causing a short-circuited or open electric connection.

A voltage change with respect to a current change is furthermore large in a region with a current of about 100 μA or less in the off region, so that in the present embodiment, it is furthermore preferable to detect a voltage between terminals in the region with a current of about 100 μA or less. Note that in a definition of the off region, a forward voltage value Vf is obtained at a point where an extrapolating line from a normal use region of (a) crosses with the voltage axis in the graph, wherein only an axis of abscissa is a logarithmic scale as shown in FIG. 1. Note that the present invention is not limited to this method and various existing definitions of a forward voltage value Vf of diodes can be used.

Figure 2:
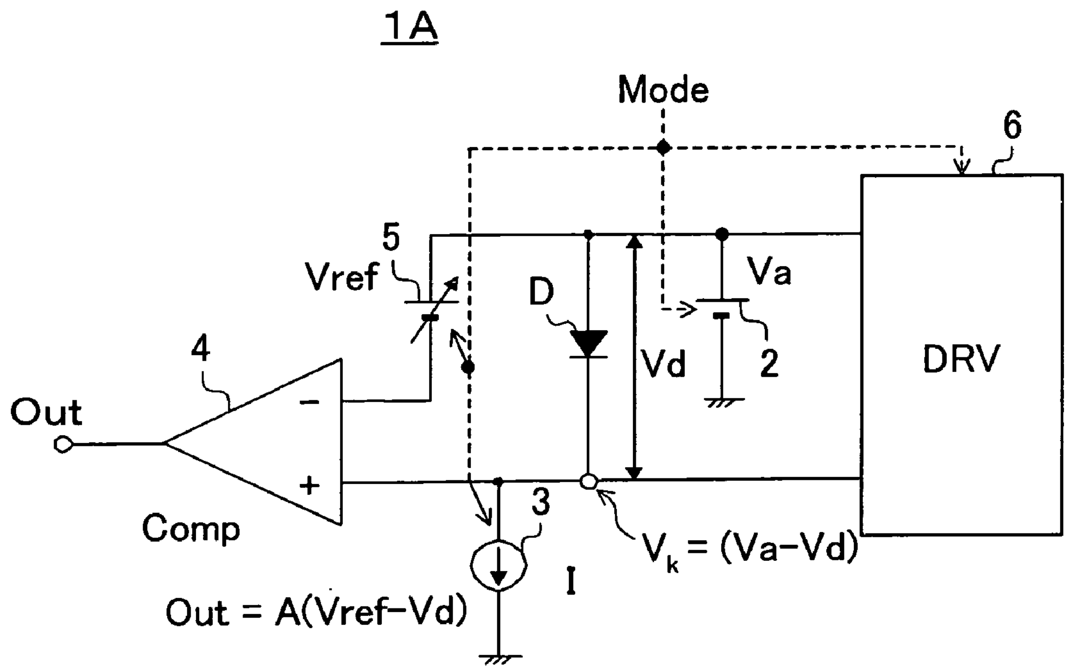
FIG. 2 is a circuit diagram of a voltage detection circuit for detecting a voltage between terminals, which can be used in the first embodiment.
Figure 3:
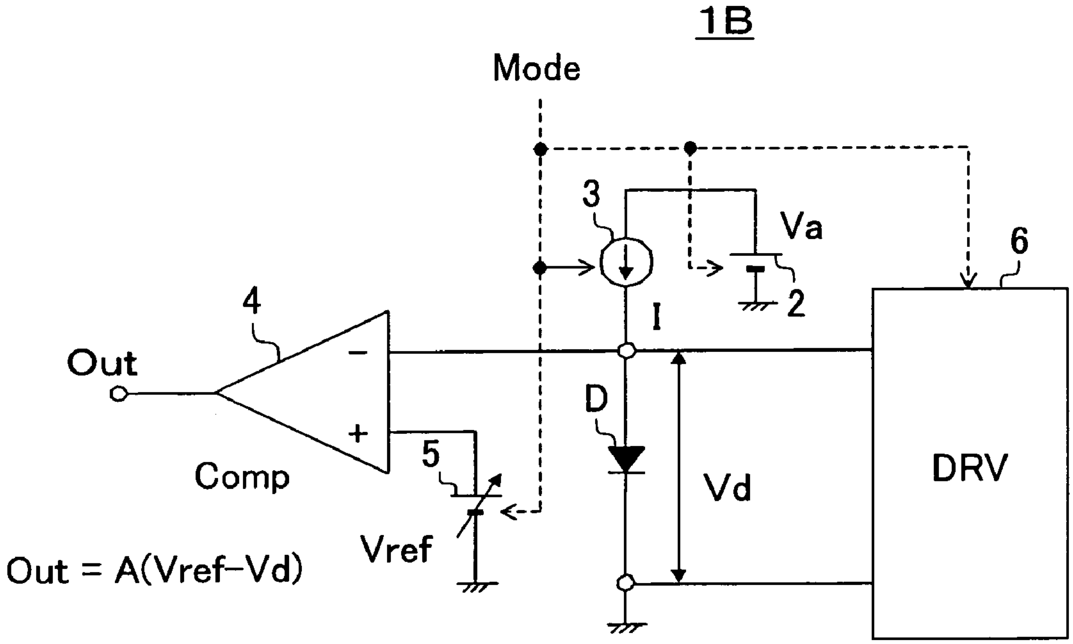
FIG. 3 is a circuit diagram of another voltage detection circuit for detecting a voltage between terminals, which can be used in the first embodiment.

FIG. 2 and FIG. 3 are views of a voltage detection circuit for detecting a voltage between terminals which can be used in the present embodiment.

A voltage detection circuit 1A shown in FIG. 2 is an anode common connection type voltage detection circuit wherein a common connection side of an LED is on the anode side. The voltage detection circuit 1A comprises a power source 2 connected between an anode of a light-emitting diode D as an LED and a ground voltage, a constant current source 3 connected between a cathode of the light-emitting diode D and the ground voltage, and a comparator 4. A "+" input terminal of the comparator 4 is connected to the cathode (a voltage: Vk) of the light-emitting diode D. Also, between a "−" input terminal of the comparator and the anode of the diode D is connected a supply means 5 of the reference voltage Vref with a variable voltage value in the direction as shown in the figure. The supply means 5 of the reference voltage Vref may be built in the voltage detection circuit 1A or a means to supply the reference voltage Vref from the outside. Note that between the anode and the cathode of the light-emitting diode D is connected a driver (DRV) 6 for making a predetermined current flow to the light-emitting diode in accordance with a video signal of an image to be displayed in a normal image display mode.

The driver 6, the constant current source 3 and the reference voltage supply means 5 explained above are controlled by a mode switching signal "Mode". When the mode switching signal "Mode" indicates an "image display mode", activation of the constant current source 3 and the reference voltage supply means 5 is stopped and only the driver 6 is activated. Therefore, the light-emitting diode D emits light at a luminance in accordance with the video signal.

On the other hand, when the mode switching signal "Mode" indicates a "defect detection mode", inversely, activation of the driver 6 is stopped and the constant current source 3 and the reference voltage supply means 5 are activated. Therefore, a constant current I flows in the light-emitting diode D biased by a voltage Va of the power source 2. The constant current I is preferably a very small current of about 100 μA or less, so that detection of a voltage Vd between terminals becomes possible in a range with a very small current wherein detection sensitivity is high. The detection method of the present embodiment compares by the comparator 4 a voltage of one terminal of the light-emitting diode D, the cathode voltage Vk here, with a difference (Va−Vref) of the voltage Va and the reference voltage Vref when a constant very small current I flows. The cathode voltage Vk is (Va−Vd), so that the voltage Va is cancelled out, consequently, a comparator output "Out" becomes A(Vref−Vd). Here, "A" indicates an amplification factor of the comparator. The comparator output "Out" has a high level "R" potential when the voltage Vd between terminals of the light-emitting diode D is smaller than the reference voltage Vref, while has a low level "L" potential when the voltage Vd between terminals of the light-emitting diode D is not smaller than the reference voltage Vref.

A voltage detection circuit 1B shown in FIG. 3 is a cathode common connection type voltage detection circuit wherein the common connection side of the LED is on the cathode side. A cathode of the light-emitting diode D as an LED is grounded. The voltage detection circuit 1B comprises a constant current source 3 connected in series between an anode of the light emitting diode D and the ground voltage, a power source 2 and the comparator 4. Between a "+" input terminal of the comparator 4 and the ground voltage is connected a supply means 5 of the reference voltage Vref with a variable voltage value. Also, a "−" input terminal of the comparator 4 is connected to one terminal of the light-emitting diode D, an anode (voltage: Vd) here. The supply means 5 of the reference voltage Vref may be built in the voltage detection circuit 1B or a means to supply the reference voltage Vref from the outside. Note that between the anode and the cathode of the light-emitting diode D is connected a driver (DRV) 6 for making a predetermined current flow to the light-emitting diode in accordance with a video signal of an image to be displayed.

The driver 6, the constant current source 3 and the reference voltage supply means 5 explained above are controlled by a mode switching signal "Mode". When the mode switching signal "Mode" indicates the "image display mode", activation of the constant current source 3 and the reference voltage supply means 5 is stopped and only the driver 6 is activated. Therefore, the light-emitting diode D emits light at a luminance in accordance with the video signal.

On the other hand, when the mode switching signal "Mode" indicates the "defect detection mode", inversely, activation of the driver 6 is stopped and the constant current source 3 and the reference voltage supply means 5 are activated. Therefore, a constant current I flows to the light-emitting diode D biased by the voltage Va of the power source 2. The constant current I is preferably a very small current of about 100 μA or less, so that detection of a voltage Vd between terminals becomes possible in a range with a very small current wherein detection sensitivity is high. The detection method of the present embodiment compares by the comparator 4 a voltage of one terminal of the light-emitting diode D, which is the anode voltage (=Vd) here, with the reference voltage Vref when a constant very small current X flows, and a comparator output "Out", becomes A(Vref−Vd). Here, "A" indicates an amplification factor of the comparator. The comparator output "Out" becomes a high level "H" when the voltage Vd between terminals of the light-emitting diode D is smaller than the reference voltage Vref, and becomes a low level "L" when the voltage Vd between terminals is not smaller than the reference voltage Vref.

While not particularly illustrated, a large number of light-emitting diodes D are arranged on the image display face of the LED display, and a driver IC is provided as a driver circuit device thereof. The voltage detection circuit 1A or 1B having the above configuration is formed in the driver IC. Note that the number of LEDs driven by one driver IC may be any, and there are a variety of embodiments of the voltage detection circuit 1A or 1B in accordance therewith. FIG. 2 and FIG. 3 show the case where the voltage detection circuit 1A or 1B is provided for each light-emitting diode D, but the voltage detection circuit may be provided for a plurality of light-emitting diodes D each. In this case, a selection circuit for selecting light-emitting diodes subjected to defect detection from a plurality of light-emitting diodes is furthermore necessary.

Figure 4:
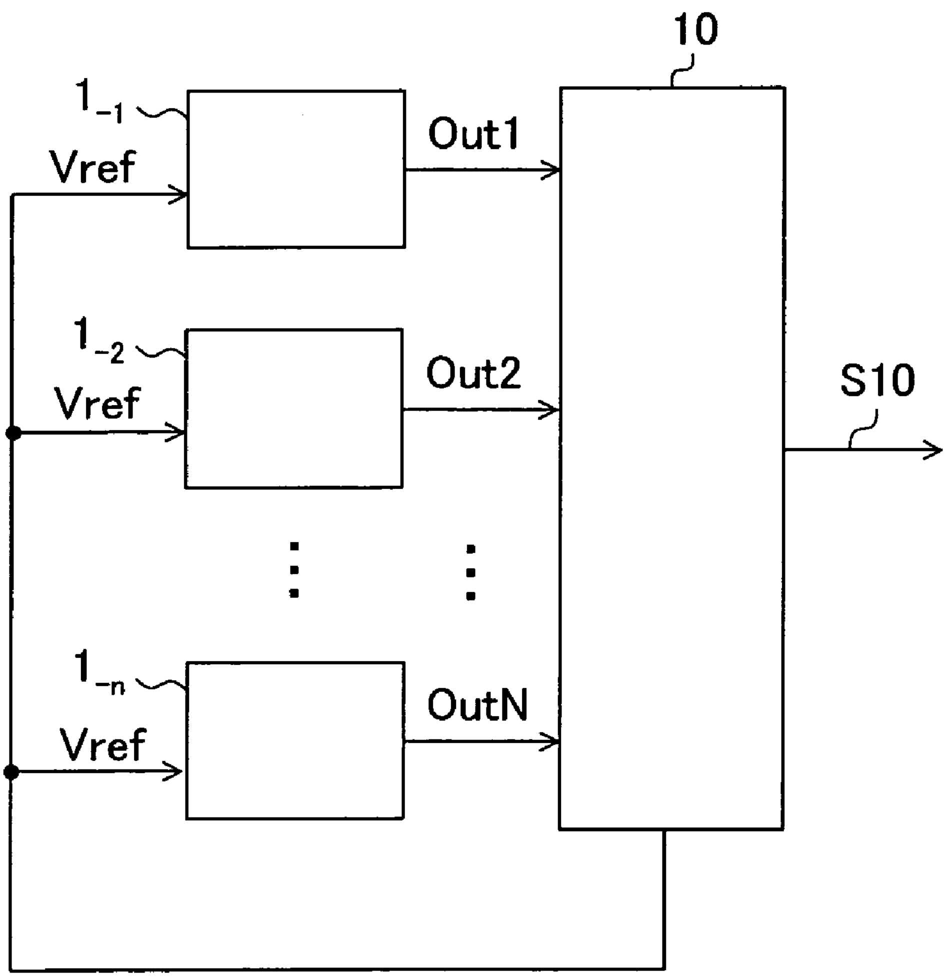
FIG. 4 is a block diagram of the simplified configuration of a drive circuit device according to the first embodiment.

The driver IC further comprises, as shown in FIG. 4, a defect detection circuit 10 for specifying a defective diode based on a detection result (the comparator output "Out") of the voltage detection circuit. In FIG. 4, a plurality of voltage detection circuits $\mathbf{1}_{-1}$, $\mathbf{1}_{-2}$, . . . , $\mathbf{1}_{-n}$ are configured by any one of the circuits 1A and 1B shown in FIG. 2 and FIG. 3. The defect detection circuit 10 receives a plurality of outputs "Out1", "Out2", "OutN" of the plurality of voltage detection circuits $\mathbf{1}_{-1}$, $\mathbf{1}_{-2}$, . . . , $\mathbf{1}_{-n}$ and obtains a distribution of a voltages Vd between terminals based on the values. To obtain the distribution, the defect detection circuit 10 changes the reference voltage Vref to be supplied to the voltage detection circuits $\mathbf{1}_{-1}$, $\mathbf{1}_{-2}$, . . . $\mathbf{1}_{-n}$, for example, from the lower voltage value to the higher by a predetermined step, and receives the outputs "Out1", "Out2", . . . , "OutN" of the voltage detection circuit each time. This operation is repeated for necessary times. As a result, when there is a voltage between terminals being away from an end of the distribution in the distribution of the voltages Vd between terminals, a light-emitting diode having the isolated voltage between terminals is specified as a defect or one with a high probability of becoming defective. More specifically, when there is an isolated voltage between terminals with a still lower voltage than a lower end of the distribution, a light-emitting diode having the voltage between terminals is specified as a short-circuited defect or one with a high probability of becoming a short-circuited defect. Alternately, when there is an isolated voltage between terminals with a still higher voltage than an upper end of the distribution, a light-emitting diode with the voltage between terminals is specified as an open defect or one with a high probability of becoming open defect. The defect detection results are output as a signal S10 from the defect detection circuit 10. The signal S10 electrically indicates which light-emitting diode (LED) on the LED display is defective, and the defective LED can be easily exchanged.

Second Embodiment

In the second embodiment, the case of applying the defect detection method shown in the first embodiment to an LED display for transferring light-emitting data in a token transfer method of a daisy chain mode will be explained.

Figure 5:
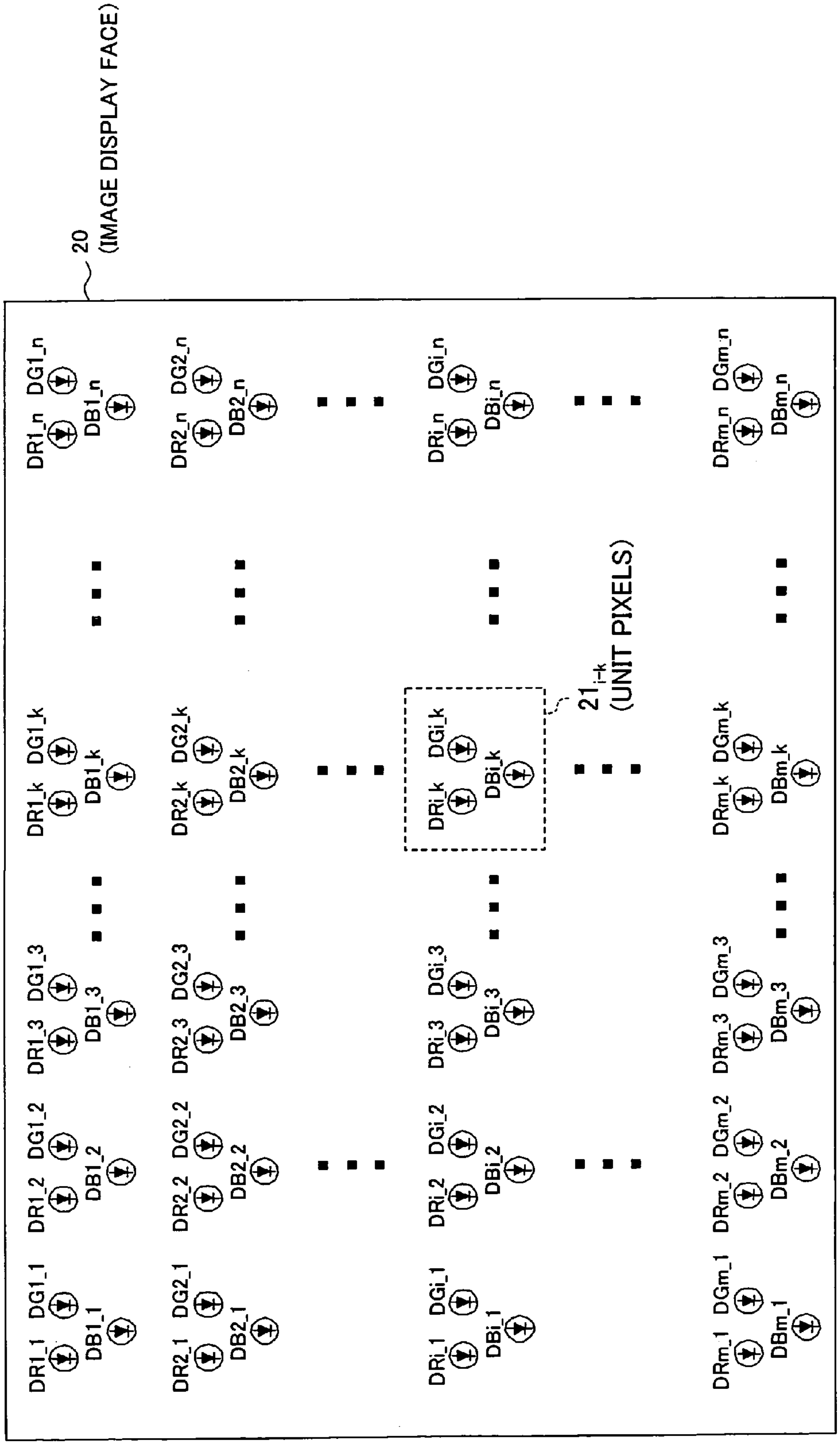
FIG. 5 is a schematic view of an LED arrangement on an image display face in an LED display according to a second embodiment.
Figure 6:
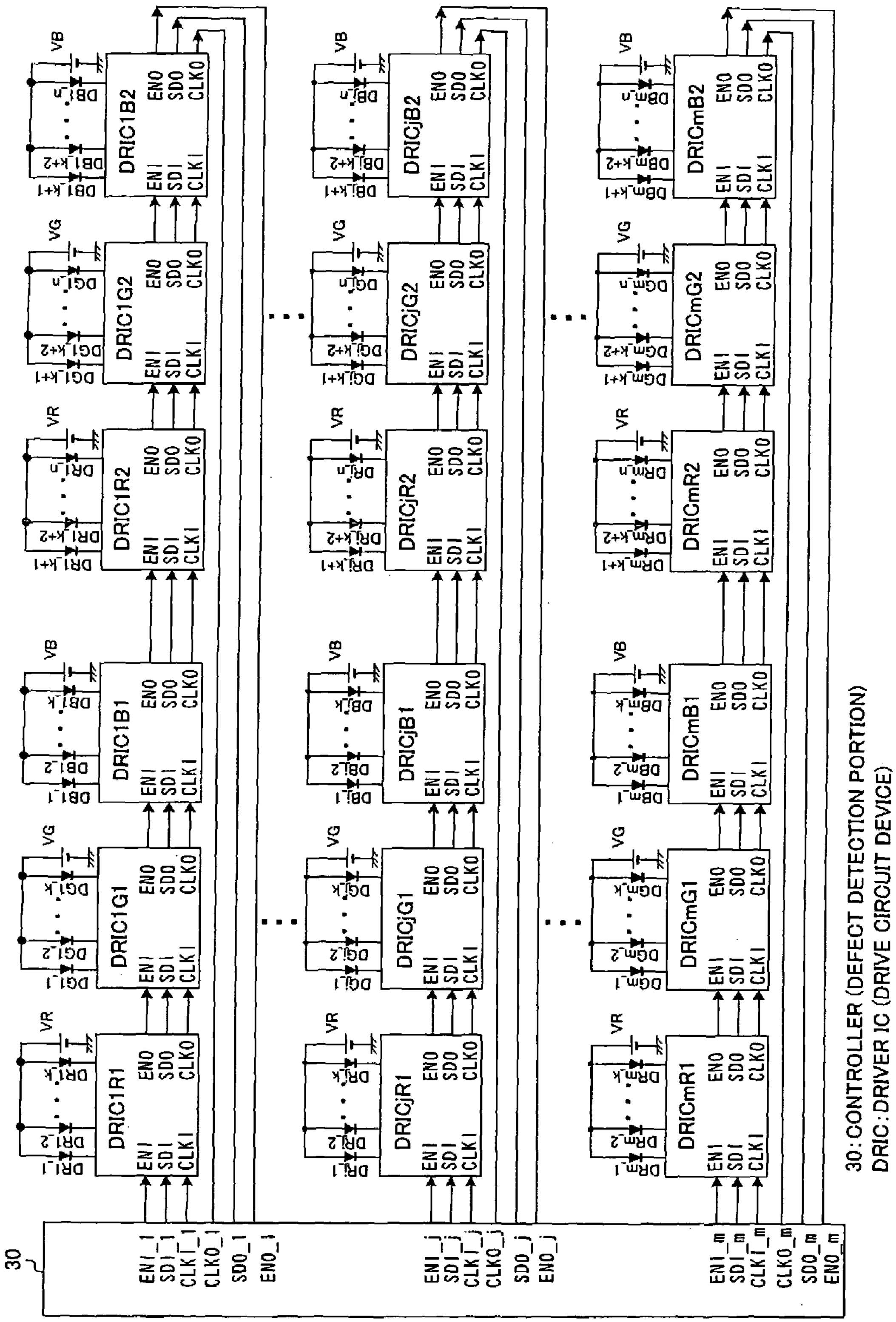
FIG. 6 is a block diagram of a connection relationship of driver ICs and a controller in the LED display according to the second embodiment.

FIG. 5 is a schematic view of an LED arrangement on the image display face. Also, FIG. 6 is a block diagram of a connection relationship of driver ICs of LEDs and a controller.

On the image display face 20 shown in FIG. 5, unit pixels 21*i_k* (i=1, 2, . . . , m, and k=1, 2, . . . , n) composed of three LEDs of red (R), green (G) and blue (B) are arranged by m lines by n columns. Here, red LEDs are indicated by DRi_k, green LEDs are DGi_k, and blue LEDs are DBi_k.

The driver IC for driving these LEDs configures an embodiment of a "drive circuit device" of the present invention and is provided for each color of the LEDs in a group of the predetermined number of unit pixels. In an example shown in FIG. 6, each of a former group of a k-number of unit pixels and a latter group (n-k) number of unit pixels on one line is provided with driver ICs for respective colors. Here, for example, in the former unit pixels on the j-th (j=1 to m) line, a driver IC for driving red LEDs is indicated as "DRICjR1", a driver IC for driving green LEDs is indicated as "DRICjG1" and a driver IC for driving blue LEDs is indicated as "DRICjB1". Also, in a latter half group of unit pixels on the j-th line, a driver IC for driving red LEDs is indicated as "DRICjR2", a driver IC for driving green LEDs is indicated as "DRICjG2" and a driver IC for driving blue LEDs is indicated as "DRICjB2".

Assignment of the driver ICs as such is for a forward voltage Vf and a current varying in accordance with a kind of the LEDs. A power source for biasing LEDs connected in parallel with the driver IC is capable of applying voltages of different values VR, VG and VB for the respective RGB colors. These voltage values correspond to the power source voltage Va explained in the first embodiment.

Note that in the example shown in FIG. 6, a line is divided to the former half and the latter half to be driven for convenience of the explanation, but a line is normally divided to more precise units to be driven. Note that in the case with a relatively small number of pixels, etc., all LEDs on one line may be driven by respective RGB. Also, in the case of a mono color displaying or in the case of other data transfer methods, an LED group of a predetermined number of lines and columns may be driven at a time or by respective RGB. Furthermore, in any of the above cases, when using a driver IC having a function capable of setting a plurality of currents for driving the LEDs, LEDs of different colors can be driven by one driver IC.

The controller 30 is connected to a driver IC on the first stage and the final stage of respective lines, that is, a driver IC (DRIC1R1 and DRIC1B2) on the first line, . . . , a driver IC (DRICjR1 and DRICjB2) on the j-th line, . . . , and a driver IC (DRICmR1 and DRICmB2) on the m-th line. The controller 30 transfers to driver ICs on the first stage of the respective lines data relating to all driver ICs connected to their subsequent stages in a successive serial way in accordance with a connection order of the LEDs and drive circuit.

Data transmitted by the controller 30 is data of light-emitting parameters, such as luminance of a respective LED, and a various control data.

The light-emitting parameter data of an LED includes, for example, data of "1" or "0" for specifying "supplying" or "not supplying" a current to the LED. In the case of a driver IC having a function of setting by data a current for driving the LED, data of the current value is also included in the light-emitting parameter data.

The control data includes mode setting data. The mode setting data indicates data for switching a normal operation mode at the time of normal operation, where an LED emits light once or continuously, and a defect detection mode and other modes, and includes data of the mode switching signal "Mode" explained in the first embodiment (refer to FIG. 2 and FIG. 3). Also the control data includes output Vdac data of an analog-digital converter (DAC) as the reference voltage Vref to be input to the comparator 4 (refer to FIG. 2 and FIG. 3) in the detection circuit 1A or 1B of a voltage Vd between terminals of an LED. Furthermore, the control data includes detection data of the terminal Vd between terminals of an LED, an enable signal EN and a clock signal CLK. Note that when the constant current I shown in FIG. 2 and FIG. 3 is made to be variable, the current I can be changed in the off region at a forward voltage Vf or less. In this case, information of the current changing is included in the control data.

It is configured that the control data and LED luminance data are serially transferred to be supplied for light mission of the LED display or defect detection, etc., then, made to return to the controller 30 from the driver IC on the final stage. Note that the clock signal CLK may be configured to supply in parallel to be supplied to the driver IC in the line.

Figure 7:
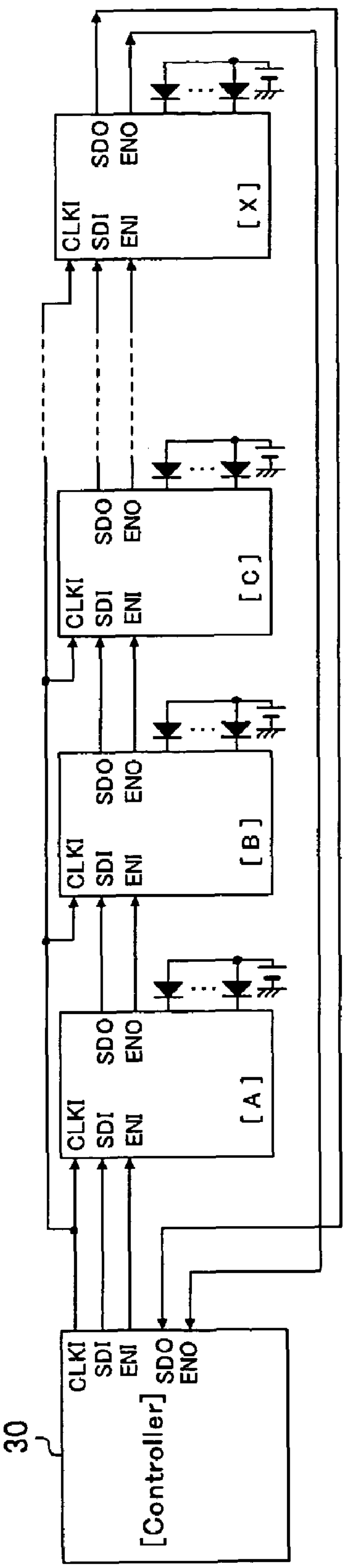
FIG. 7 is a circuit block diagram of a generalized connection relationship of driver ICs on any line and a controller in the configuration of supplying a clock signal in parallel.
Figure 8:
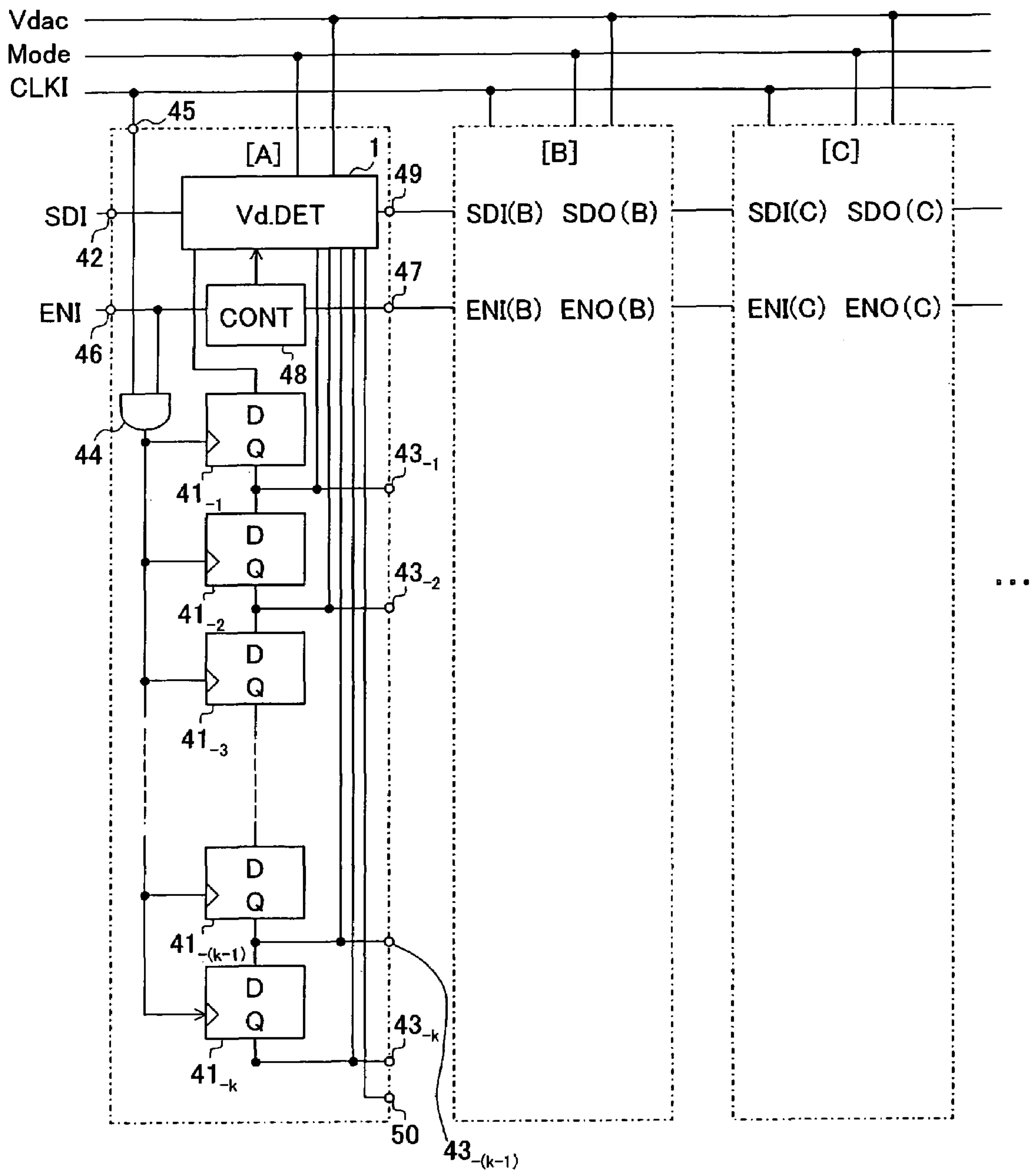
FIG. 8 is a circuit diagram of the detailed circuit configuration in the driver ICs shown in FIG. 7.

FIG. 7 is a circuit block diagram of a generalized connection relationship of an arrangement of any line of driver ICs and a controller in the configuration of supplying a clock signal in parallel. FIG. 8 is a circuit diagram of a detailed circuit configuration in the driver IC shown in FIG. 7. Note that in the generalized FIG. 7 and FIG. 8, the driver ICs are indicated by [A], [B], [C], . . . , [x] successively from the first stage. Also, in FIG. 8, only the configuration of the driver IC [A] is shown but other driver ICs are configured in the same way.

As shown in FIG. 8, each driver IC comprises a shift register composed of flip-flips $\mathbf{41}_{-1}$, $\mathbf{41}_{-2}$, $\mathbf{41}_{-3}$, . . . $\mathbf{41}_{-(k-1)}$, $\mathbf{41}^{-k}$ connected in series by the number corresponding to the number k of LEDs to be connected. Each of the data output terminals (Q) of the flip-flops $\mathbf{41}_{-1}$, $\mathbf{41}_{-2}$, $\mathbf{41}_{-3}$, . . . , $\mathbf{41}_{-(k-1)}$ is connected to a data input terminal (D) of the next flip—flip. Connection midpoints of these and a data output terminal (Q) of the flip-flop $\mathbf{41}_{-k}$ on the final stage are successively connected to the connection terminals $\mathbf{43}^{-1}$, $\mathbf{43}^{-2}$, $\mathbf{43}^{-3}$, . . . $\mathbf{43}^{-(k-1)}$, $\mathbf{43}^{-k}$ of the LEDs. Clock inputs of the k-number of flip-flops are connected to an output of a two-input AND gate 44. One input of the AND gate 44 is connected to a supply terminal 45 of the clock signal CLKI, and the other input is connected to an input terminal 46 of an enable signal ENI. Between the supply terminal 46 and the output terminal 47 of the enable signal ENI is, for example, connected a counter (CONT) 48 for clocking a clocking pulse for maintaining a high level "H" of the enable signal for a predetermined time. Also, between the input terminal 42 and the output terminal 49 of the data signal SDI is connected a voltage detection circuit (Vd. DET) between terminals of the LED. The voltage detection circuit 1 is connected to supply terminals 50 of the above connection terminals $\mathbf{43}_{-1}$, $\mathbf{43}_{-2}$, $\mathbf{43}_{-3}$, . . . $\mathbf{43}_{-(k-1)}$, $\mathbf{43}_{-k}$ of the LED and a supply terminal 50 of the bias power source voltage Va (VR, VG or VB). Also, the voltage detection circuit 1 is supplied with a reference voltage Vdac generated by a DAC in the controller 30 and a mode switching signal "Mode". Note that supply lines of the reference voltage Vdac and the mode switching signal "Mode" are omitted in FIG. 6 and FIG. 7.

In FIG. 8, the reference voltage Vdac and the mode switching signal "Mode" are supplied from outside of the driver IC, but they may be generated inside the driver IC. In this case, each driver IC is, for example, provided with a DAC for generating the reference voltage Vdac and a mode switching signal judgment circuit for outputting the mode switching signal "Mode", etc.

When the mode switching signal "Mode" indicates the "normal operation mode", the voltage detection circuit 1 inputs an input data signal SDI input from the input terminal 42 to the data input terminal (D) of the flip-flop $\mathbf{41}_{-1}$ on the first stage. A shift operation of k-number of flip-flops are regulated by the AND gate 44 and, only in a period when the input enable signal ENI is at a high level "H", a clock signal is supplied and the data shift operation is performed. Accordingly, for example, luminance data is passed on as a light-emitting parameter in accordance with a video signal SDI input to the flip-flops $\mathbf{41}_{-1}$, $\mathbf{41}_{-2}$, $\mathbf{41}_{-3}$, . . . $\mathbf{41}_{-(k-1)}$, $\mathbf{41}_{-k}$ in this period, consequently, a k-number of LEDs emit light in accordance with the light-emitting parameter.

The period when the input enable signal ENI is at a high level "H" is monitored by the counter 48 clocking a predetermined number of clock pulses. For example, when the predetermined number of clock pulses is detected immediately before the end of the enable period "H", the counter 48 raises a counter output from a low level "L" to a high level "H" immediately. This level shift (an output enable signal ENO(A)) is input as a new enable signal ENI(B) to the drive IC [B] on the next stage. As a result, the enable period "H" is passed on with almost no delay, and LEDs connected to the drive IC [B] emit light in this period.

The series of operation is successively repeated in the next drive IC [C], drive ICs ([D], [E], . . . ) in the middle omitted in FIG. 7, and in the driver IC [X] on the final stage, then, an output enable signal ENO(X) is returned from the final stage to the controller 30 and, furthermore, taken over by a driver IC on the first stage of the next line.

When data transfer for all driver ICs is completed by repeating the data transfer operation on one line for m-times, displaying of one screen is completed at this point. In this data transfer method, "H" data of the enable signal as prior information (token) of the driver IC and video data are circulated, and each driver IC displays an image only in the enable "H" period when the token is received. Therefore, scanning of video signals can be performed with a simple configuration without wiring.

On the other hand, when the voltage detection circuit 1 detects that the mode switching signal "Mode" indicates the "defect detection mode", a detection operation of a voltage Vd between terminals of an LED is performed by the voltage detection circuit 1. This detection operation of the voltage between terminals is also performed in a period when a token is received, that is, in the "H" period of the enable signal EN. Accordingly, in the same way as in the above image display, detection of the voltage Vd between terminals is performed on all LEDs while the token goes around the all driver ICs. Note that in this defect detection mode, for example, activation of the driver 6 shown in FIG. 2 and FIG. 3 is stopped by control by the mode switching signal "Mode", so that an image is not displayed.

Figure 9:
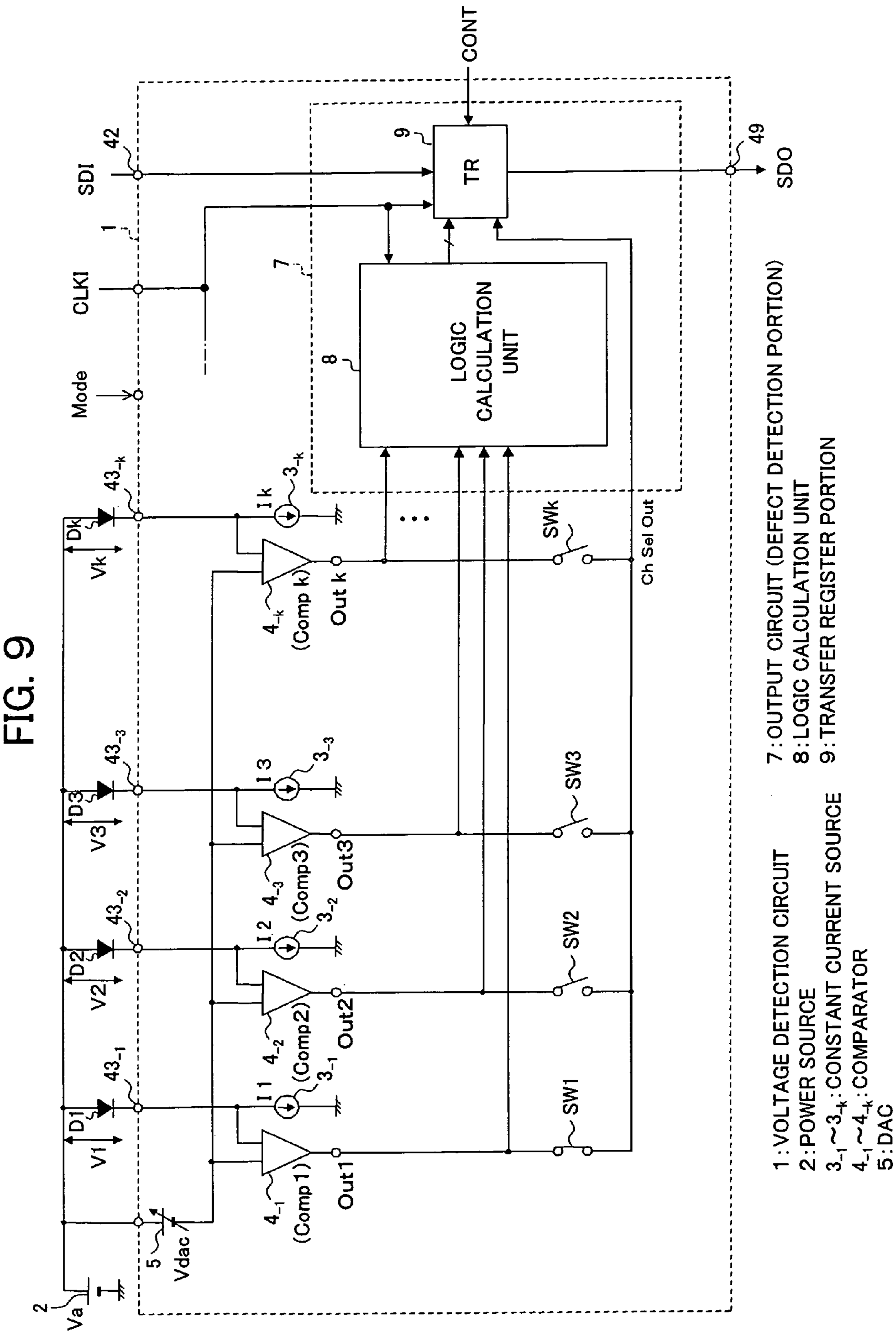
FIG. 9 is a circuit block diagram of the configuration of a voltage detection circuit.
Figure 10:
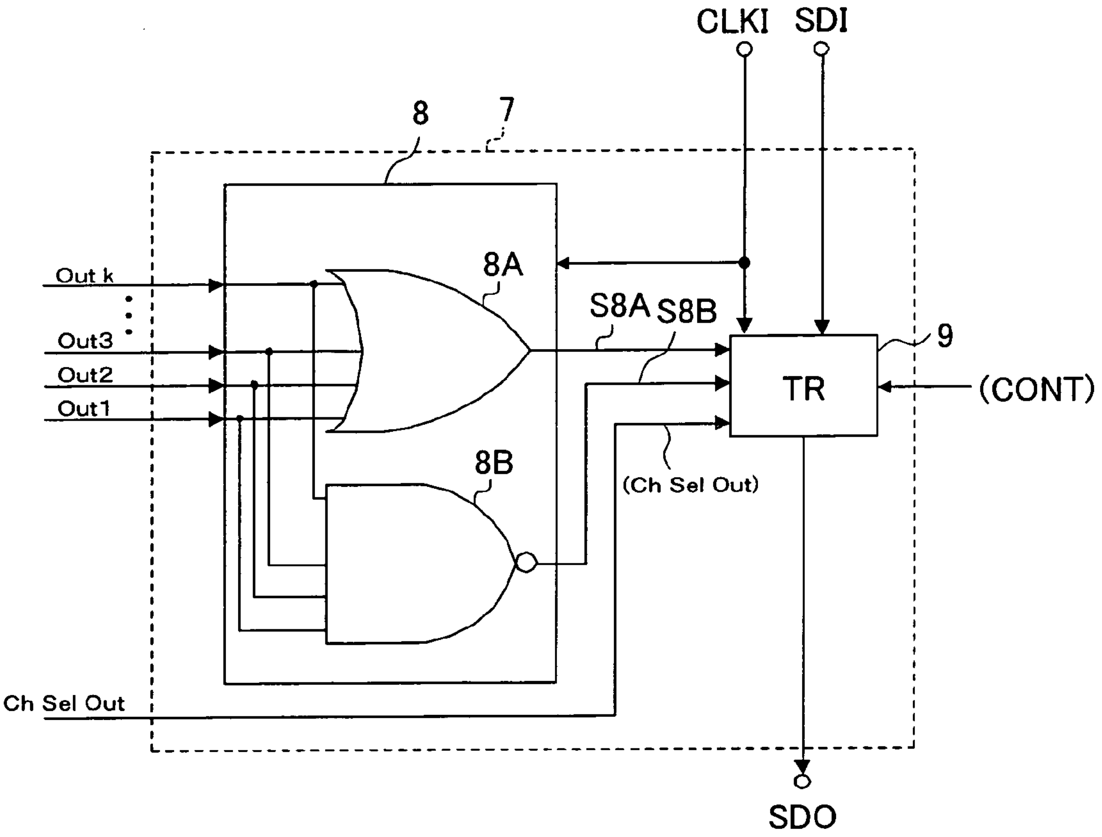
FIG. 10 is a circuit block diagram of a first configuration example of an output circuit in the voltage detection circuit.

FIG. 9 is a circuit block diagram of the configuration of the voltage detection circuit 1. FIG. 10 is a circuit block diagram of a detailed logic calculation unit in the voltage detection circuit 1.

In the voltage detection circuit 1 shown in FIG. 9, the anode common connection type diode D, the power source 2, the constant current source 3, the comparator 4 and the reference voltage supply means (DAC in this example) 5 shown in FIG. 2 are treated as a basic unit, and k-number of these are connected in parallel. Note that, in FIG. 9, the DAC 5 is illustrated to be in the voltage detection circuit 1, but this is a schematic illustration, and the case where the reference voltage Vdac is supplied from the outside as shown in FIG. 8 is also included.

Light-emitting diodes (LED) D1, D2, D3, . . . , Dk are connected between the power source 2 for supplying a bias voltage Va and connection terminals $\mathbf{43}_{-1}$ to $\mathbf{43}_{-k}$ of the LEDs, respectively. The connection terminals $\mathbf{43}_{-1}$ to $\mathbf{43}_{-k}$ of the LEDs are connected to one inputs of the comparators $\mathbf{4}_{-1}$, $\mathbf{4}_{-2}$, $\mathbf{4}_{-3}$, . . . , $\mathbf{4}_{-k}$, respectively. Also, between the connection terminals $\mathbf{43}_{-1}$ to $\mathbf{43}_{-k}$ and the ground voltage are connected constant current sources $\mathbf{3}_{-1}$, $\mathbf{3}_{-2}$, $\mathbf{3}_{-3}$, . . . , $\mathbf{3}_{-k}$, respectively. The other inputs of the comparators $\mathbf{4}_{-1}$, $\mathbf{4}_{-2}$, $\mathbf{4}_{-3}$, . . . , $\mathbf{4}_{-k}$ are connected to the power source 2 via the DAC 5 so as to be supplied with a voltage (Va-Vdac).

Respective outputs Out1, Out2, Out3, . . . , Outk of the comparators $\mathbf{4}_{-1}$, $\mathbf{4}_{-2}$, $\mathbf{4}_{-3}$, . . . , $\mathbf{4}_{-k}$ are connected to the output circuit 7. The output circuit 7 comprises a logic calculation unit 8 and a transfer register portion.

(TR) 9. The logic calculation unit 8 and a transfer register portion (TR) 9 are driven by an input clock signal CLKI input to the voltage detection circuit 1.

The logic calculation unit 8 calculates a particularity of voltages between terminals of LEDs based on the comparator output, and outputs the result as basic data for detecting an LED with a high probability of being defective to the transfer register portion 9. Here, the "particularity" indicates a voltage between terminals as an isolated point being away from an end of main distribution of the voltages between terminals.

The logic calculation unit 8 is configured by a k-input OR gate circuit 8A and a k-input NAND gate circuit 8B as shown in FIG. 10.

The respective inputs of the OR gate circuit 8A are connected to the respective comparators, so that comparator outputs Out1, Out2, Out3, . . . , Outk can be input. A signal S8A is output from the OR gate circuit 8A to the transfer register portion 9. The signal S8A becomes "H" in the case where there is at least one comparator output having a smaller voltage Vd (d=1 to k) between terminals of a diode than the reference voltage Vdac and a comparator output of "H" among the k-number of comparator outputs, while becomes "L" in the case where all voltages Vd between terminals are not less than the reference voltage Vdac. The signal S8A detects an existence of a voltage between terminals with a probability of becoming particularity at the lower end of the distribution to generate basic data of detecting a short-circuited defect, so that the signal S8A will be referred to as a "short-circuited detect basic data signal" below.

In the same way, respective inputs of the NAND gate circuit 8B are connected to the respective comparators so that the comparator outputs Out1, Out2, Out3, . . . , Outk can be input, respectively. A signal S8B is output from the NAND gate circuit 8B to the transfer register portion 9. The signal S8B becomes "H" in the case where there is at least one comparator output having a voltage Vd between terminals of a diode of not less than the reference voltage Vdac and a comparator output of "L" among the k-number of comparator outputs, while becomes "L" in the case where all voltages Vd between terminals are smaller than the reference voltage Vdac. The signal BBB detects an existence of a voltage between terminals with a probability of becoming particularity at the upper end of the distribution to generate basic data of detecting a open defect, so that the signal S8B will be referred to as an "open detect basic data signal" below.

Also, a signal (Ch Sel Out) is input to the transfer register portion 9. The signal (Ch Sel Out) indicates what number of comparator has inverted logic when successively scanning (switching) k-number of switches SW1 to SWk connected to the respective comparator outputs in synchronization with the input clock signal as shown in FIG. 9. This signal (Ch Sel Out) gives the transfer register portion 9 information that a particularity indicated by the short-circuited defect base data signal S8A or the open defect basic data signal S8B corresponds to which diode.

The transfer register portion 9 receives the signal (Ch Sel Out) and the above two base data signals S8A and S8B, adds information of these signals to the input data signal SDI input from the terminal 42, and sends to the next driver IC via the terminal 49. At this time, the transfer register portion 9 synchronizes with timing that an output of the counter (CONT) 48 becomes "H" in FIG. 8 and outputs an output data signal SDO, for example, at timing delayed by a clock number pulse from the timing.

The comparison of voltages and collection of basic data as above (hereinafter, referred to as a defect inspection) are continuously performed by a data transfer method of the so-called token transfer as explained above successively in the driver ICs connected in series.

Figure 11:
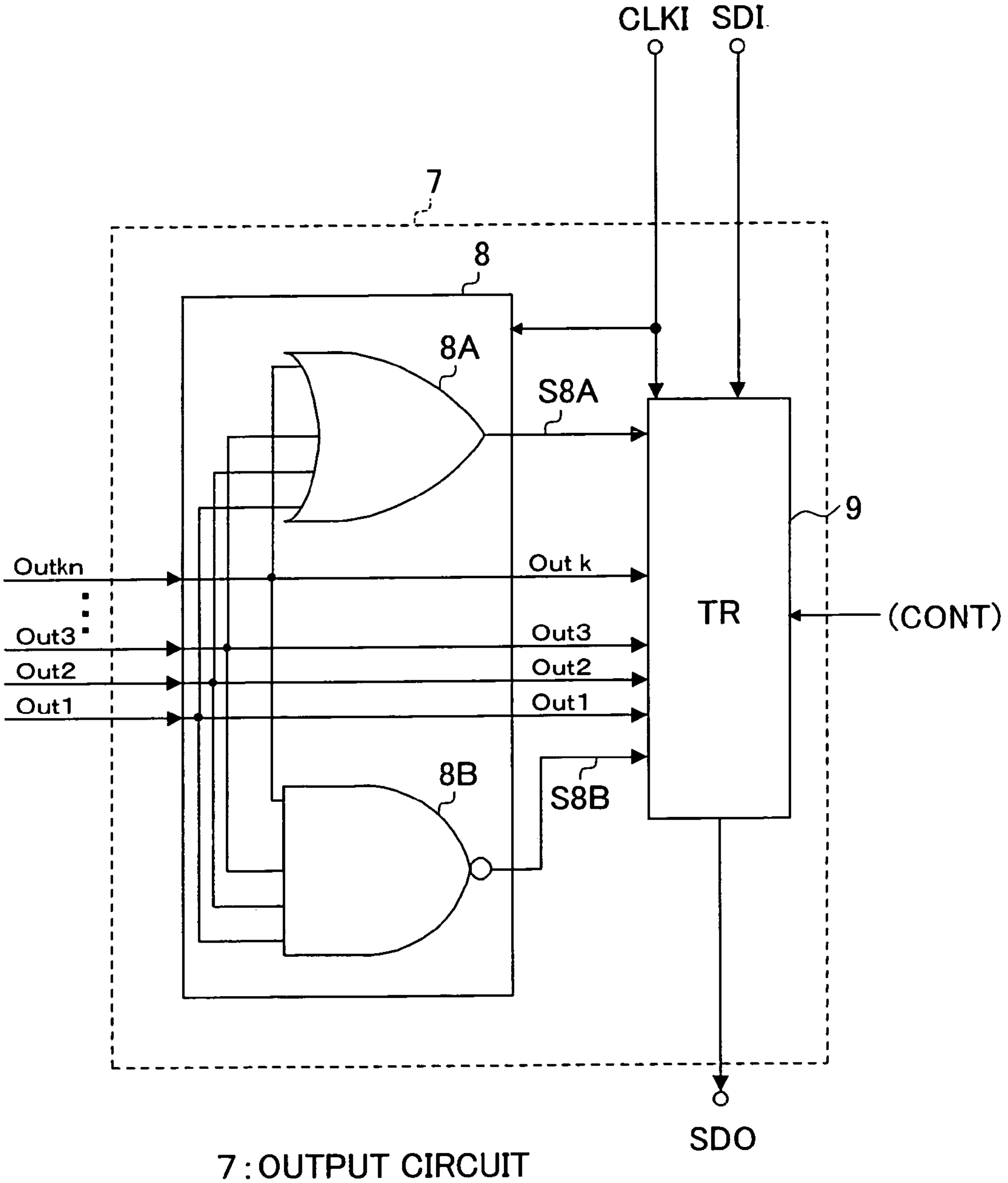
FIG. 11 is a circuit block diagram of a second configuration example of an output circuit in the voltage detection circuit.

FIG. 11 is a circuit block diagram of another configuration of an output circuit.

The output circuit 7 shown in FIG. 11 is different in a connection relationship of its logic calculation unit 8 and transfer register portion 9 from that in the case in FIG. 10. Namely, comparator outputs Out1, Out2, Out3, . . . , Outk input to the logic calculation unit 8 and used in logic calculation are also directly input to the transfer register portion 9. Therefore, the signal (Ch Sel Out) shown in FIG. 10 is unnecessary and the switches SW1 to SWk (FIG. 9) for generating the signal are also unnecessary. The transfer register portion 9 can obtain information of correspondence of defect detection base data and LEDs from the comparator outputs Out1, Out2, Out3, . . . , Out1.

Other configuration and the token transfer data transfer method are the same as those in the case in FIG. 10.

As explained above, the controller 30 shown in FIG. 6 has a function of controlling the reference voltage Vdac to be a voltage comparison standard. The controller 30 normally uses a sufficiently low or sufficiently high reference voltage Vdac considered to be not overlapping with the distribution of voltages between terminals of the LEDs to instruct a driver IC on the first stage to start the defect inspection first. As a result, the defect inspection is performed in a circularly circulating way. Consequently, a signal of data of the defect inspection of all LEDs using the initial reference voltage Vdac is returned from a driver IC on the final stage to the controller 30. On receiving the signal, the controller 30 again executes the circulation operation of the defect inspection by making the reference voltage Vdac higher or lower by a predetermined step width.

By repeating the operation until the result does not change any more even by changing the reference voltage for a predetermined number of steps, a distribution of voltages between terminals can be measured.

In the defect detection of the present embodiment, there is the case of performing defect detection by the controller 30 and the case of performing by the transfer register portion 9 provided with a defect detection function. In the former case, the controller 30 configures the embodiment of the "defect detection portion" of the present invention, and in the latter case, the output circuit 7 in the voltage detection circuit 1 configures the embodiment of the "defect detection portion" of the present invention.

When detecting a defect by the controller 30, every time defect detection data is input from the driver IC on the final stage, a memory portion therein stores the data. The controller 30 normally comprises a microcomputer and a built-in memory, so that an isolated point is detected from a distribution of voltages between terminals in interrupting processing at the time necessary distribution data is obtained or in processing at the time the defect inspection is finally finished.

For example, when gradually changing the reference voltage from low to high, an isolated point of a short-circuited defect appears first. In the case where "H" is output from the comparator 4 in voltage comparison using a certain reference voltage, when comparator outputs are at "L" in inspecting at the reference voltages round that (for example, reference voltages with difference of one step or more), an LED corresponding to the comparator is judged to be a short-circuited defect or one with a high probability of becoming a short-circuited detect. In the same way, detection of an open defect and one with a high probability of becoming an open defect can be performed at the upper end of the distribution. Note that when changing the reference voltage from high to low, an open defect can be detected first, then a short-circuited defect can be detected.

Defect detection results are output as an electric signal from the controller 30 to the outside.

On the other hand, when the transfer register portion 9 performs defect detection, a memory capacity for storing necessary inspection data for judging an isolation point is required in the transfer register portion itself. For example, in an example of detecting an isolation point, for example, in ±2 steps, a memory capacity for storing history of inspection data of an amount of 5 steps in total is required.

The transfer register portion 9 is configured that when THE is output from the comparator 4 in the voltage comparison using a certain reference voltage, and when all inspected data bits are at "L" at the reference voltages of an amount of ±2 steps around it, an output of a not shown logic gate circuit for examining that becomes, for example, "H", and a detection flag of a short-circuited defect is on. Also, transfer register portion 9 is configured that when "L" is output from the comparator 4 in the voltage comparison using a certain reference voltage, and when all inspected data bits are at "H" at the reference voltages of an amount of ±2 steps around it, an output of a not shown logic gate circuit for examining that becomes, for example, "H", and a detection flag of an open defect is on. The flag information of short-circuited defect or an open defect and information for specifying a defective LED are added to the input data signal SDI in the transfer register portion 9 and output. Therefore, every time information of defect detection on a line having a detected defect passes through the controller 30, it is output as an electric signal from the controller 30 to the outside.

FIG. 12A to FIG. 12K show timing charts of a signal for explaining a serial transfer of defect detection data in the case of performing defect detection by the transfer register portion 9. Here, an input data signal SDI(A) input to the driver IC [A] on the first stage from the controller 30 is shown in FIG. 12A, a data signal SDO[A]=SDI[B] sent from the driver IC [A] to the next driver IC [B] is shown in FIG. 12D, a data signal SDO[B]=SDI[C] sent from the driver IC [B] to the next driver IC [C] is shown in FIG. 12F, a data signal SDO[X−1]SD1[X] sent from the driver IC[X−1] to the next driver IC [X] is shown in FIG. 12H, and a data signal SDO[X] sent from the driver IC [X] to the controller 30 is shown in FIG. 12J, respectively. Also, pulses of enable signals EN transferred by the token transfer are shown in FIG. 12C, FIG. 12E, FIG. 12G, FIG. 12I and FIG. 12K and a clock signal CLKI is shown in FIG. 12B, respectively.

When an input data signal SDI(A) is input to the driver IC [A] on the first stage and its enable signal ENI(A) becomes "H", as shown in FIG. 12D, detection of a voltage between terminals of an LED and defect detection are performed in the voltage detection circuit 1 in the driver IC [A], for example, at timing delayed by 2 pulses from the clock signal CLKI. This processing ends while the enable signal ENI(A) is at "H", and an output data SDO[A] of the transfer register 9 is determined. When the enable signal ENI(A) of "H" becomes low, as shown in FIG. 12E, the next enable signal ENI(B) becomes high by working therewith, and the next processing of detecting a voltage and defect is performed in the driver IC [B].

The above operation is repeated and when processing of detecting a voltage and defect in the driver IC [x] on the final stage in FIG. 12J is completed, defect detection results of the whole one line are stored in the output data signal SDO(X) of the driver IC [x] at this point. The defect detection result is sent to the controller 30 by using as a trigger rising of the next enable signal shown in FIG. 12K and output as an electric signal to the outside.

A defect LED and an LED with a high probability of becoming a defect can be obtained from the signal, so that exchange of a unit pixel unit including the corresponding LED becomes easy.

According to the first and second embodiments, advantages below can be obtained.

First, by letting a very small current flow in an off region of the LED and electrically detecting a defect of an LED from a difference of voltages between terminals of the LED at this time, more accurate and swift specification of a defect LED becomes possible comparing with the method of specifying a defective LED from a difference of luminance of LEDs of the related art.

Secondary, after mounting LEDs on a substrate of unit pixel unit and under an environment the LED display is installed, particularly when the number of LEDs is large, driver ICs for driving the unit pixel unit are connected on a large number of stages, and a serial data signal transferring between the driver ICs conveys defect detection results of LEDs, by which results up to a previous stage are transferred to the subsequent stage. As a result, defect detection of LEDs is possible in the connected all driver ICs only by an output result of the final stage. As a result, a time and efforts for maintenance after the installation of a large-scale LED display can be reduced. Also, defect detection at shipping inspection of a large-scale LED inspection becomes easy, and troubles of inspection and exchanging of a defective LED display are reduced.

Thirdly, even in the case of driving a large number of LEDs by one driver IC, it is possible to know a unit pixel unit corresponding to a defective LED with less information by calculating a logical sum and a logical multiplication of the detected results of the voltage between terminals of the LEDs and transferring the results.

Fourthly, by transferring respective voltages between respective terminals or identification information of an LED together with the logic calculation result of the detection results of voltages between terminals of LEDs, it is easy to know which LED is detective in a driver IC having a defective LED.

Fifthly, since it is possible to detect a defect by making the best use of connection wiring and configuration of a driver IC of a so-called token transfer data transfer method, additional circuits and wiring for defect detection can be made minimum and an increase of the cost can be suppressed. When also considering the maintenance costs, even a cost reduction becomes possible.

According to the present invention, an image display device, a drive circuit device and a defect detection method capable of electrically performing defect detection of a light-emitting diode can be provided.

The embodiments explained above are for easier understanding of the present invention and not to limit the present invention. Accordingly, respective elements disclosed in the above embodiments includes all modifications in designs and equivalents belonging to the technical field of the present invention.

What is claimed is:

1. An image display device, comprising:

a plurality of light-emitting diodes arranged by a predetermined arrangement on an image display face;

a voltage detection portion for applying a constant current to said plurality of light-emitting diodes in an off region at a forward voltage or less in accordance with an input of a signal indicating a defect detection mode, and detecting a voltage between terminals of a light emitting diode arising when the constant current flows there through; and a defect detection portion for electrically detecting a defect from said plurality of light-emitting diodes based on a detection result of said voltage detection portion, wherein:

said voltage detection portion is provided to each of a plurality of drive circuits connected in series in one direction for respectively driving a predetermined number of said light-emitting diodes; and said defect detection portion transfers data indicating said voltages between terminals of said light-emitting diodes serially between a plurality of drive circuits in each line of said drive circuits in the horizontal direction, and based on data output from a drive circuit on the final stage being added with information of the voltages between terminals every time it transfers between the drive circuits, detects said defect in every said line in the horizontal direction.

2. An image display device as set forth in claim 1, wherein:

said voltage detection portion comprises a current source connected in series with said light-emitting diodes; and a comparator for comparing a voltage of one terminal of a light-emitting diode changing in proportional to said voltage between terminals as a result that said constant current flows to said current source with an input reference voltage;

wherein said defect detection portion repeats said defect detection on a line in the horizontal direction of said drive circuit for a plurality of times while changing said reference voltage by steps.

3. An image display device as set forth in claim 2, wherein said defect detection portion comprises a logic calculation unit for executing logic calculation on an output of said comparator corresponding to said predetermined number of light-emitting diodes and outputting a result of the logic calculation as binary data indicating an existence of a particularity with a probability of being said defect; and a transfer register for adding said binary data output from said logic calculation unit to data input from a defect detection portion on the former stage and transferring to a defect detection portion on the subsequent stage.

4. An image display device as set forth in claim 2, wherein said defect detection portion measures a distribution of said voltages between terminals by detecting a defect for a plurality of times while successively changing said reference voltage by predetermined steps, and judges a light-emitting diode having a voltage between terminals positioned being away from an end on the low voltage side in said distribution of voltages between terminals as a short-circuited defect or a defect with a high probability of becoming short-circuited.

5. An image display device as set forth in claim 2, wherein said defect detection portion measures a distribution of said voltages between terminals by performing defect detection for said plurality of times while successively changing said reference voltage by predetermined steps, and judges a light-emitting diode having a voltage between terminals positioned being away from an end of the high voltage side in said distribution of voltages between terminals as an open defect or a defect with a high probability of becoming open.

6. A drive circuit device for driving a predetermined number of light-emitting diodes, comprising a voltage detection portion for applying a constant current to said predetermined number of light-emitting diodes in an off region at a forward voltage or less in accordance with an input of a signal indicating a defect detection mode, and outputting data on voltages between terminals for electrically detecting a defect from said plurality of light-emitting diodes from a difference of voltages between terminals of light-emitting diodes arising when the constant current flows there through, wherein said voltage detection portion comprises a current source connected in series with said light-emitting diodes; and a predetermined number of comparators for comparing a voltage of one terminal of a light emitting diode changing in proportional to said voltages between terminals as a result that said constant current flows in said current source with an input reference voltage, and further comprising:

a logic calculation unit for executing logic calculation on outputs of said predetermined number of comparators and outputting a result of the logic calculation as binary data indicating an existence of a particularity with a probability of being said defect; and a transfer register for adding said binary data output from said logic calculation unit to data to be input and outputting.

* * * * *